June 19, 1962 V. S. MUKAI 3,040,255

TRANSISTORIZED TUNING CIRCUIT FOR TELEVISION TUNER OR THE LIKE

Filed May 27, 1959

INVENTOR.
VICTOR S. MUKAI
BY James and Franklin
ATTORNEYS.

United States Patent Office 3,040,255
Patented June 19, 1962

3,040,255

TRANSISTORIZED TUNING CIRCUIT FOR TELEVISION TUNER OR THE LIKE

Victor S. Mukai, Belleville, N.J., assignor to General Instrument Corporation, Newark, N.J., a corporation of New Jersey Filed May 27, 1959, Ser. No. 816,254
12 Claims. (Cl. 250—20)

Figure 1:
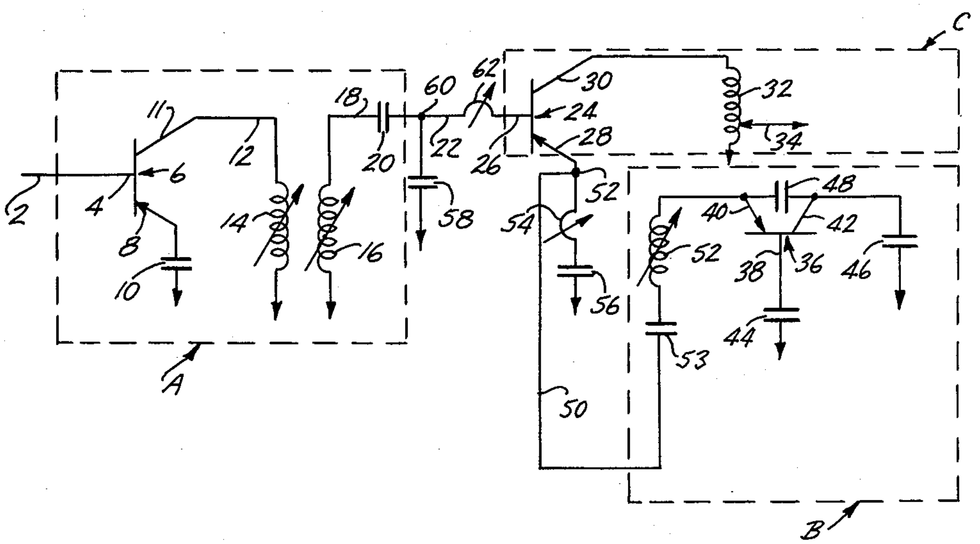

The present invention relates to a tuning circuit particularly designed for use in a television tuner, and to such a circuit which employs a transistor in the mixer stage thereof. A prime feature of the present invention involves the circuitry employed for injecting the oscillator signal into the mixer stage.

The fundamentals of tuning circuit design are well known. A tuned radio frequency (RF) stage amplifies signals at the desired frequency. A tuned oscillator stage produces an oscillator signal which has a frequency different from that of the tuned RF signal by a predetermined amount which usually remains fixed over the entire tuning range and which is called the intermediate frequency. The output from the RF stage (the amplified RF signal) and the output from the oscillator stage are combined in the mixer stage, the output from the mixer stage being at the predetermined intermediate frequency and being modulated in accordance with the received RF signal.

Modern requirements, dictated in part by manufacturing considerations deriving from the characteristics of the signals to be detected, and the nature of the electrical components employed in the tuning circuit, involve more than the mere satisfaction of the circuit fundamentals above set forth. There are many other criteria which a tuning circuit is called upon to meet, particularly when it is to be employed for the tuning of high frequency signals such as those which occur in the commercial VHF television band. Sometimes the satisfaction of certain criteria are antithetical to the satisfaction of other criteria, thus necessitating a compromise approach, and quite frequently the satisfaction of given criteria involves the use of complex circuitry which adds to cost and size and which reduces reliability.

There is at the present time a trend toward the use of transistors rather than vacuum tubes in all types of electronic circuitry because of their small size and low power consumption. However, a transistor is not a small vacuum tube. It has its own peculiarities and its own characteristics which materially affect the functioning of the electronic circuits in which it is employed, and which often require special compensating or adaptive circuitry. It has proved to be exceedingly difficult to devise a commercially practical transistorized tuning circuit which will function effectively and efficiently for commercial television transmission frequencies, and particularly those in the VHF band of frequencies. Technical problems of tracking alignment, effective transferral of power from one circuit to another, impedance matching, obtaining of proper gain, and effective isolation of different circuits have been most troublesome.

In accordance with the present invention a transistorized tuning circuit has been devised which is particularly well adapted for use in the tuning of commercial television transmissions from channels 2 through 13, which employs a limited number of circuit components connected together in an uncomplex manner, which provides for the satisfaction of the prime requisites of a tuning circuit in an exceptionally effective manner, and which may be readily adjusted on the production line. Moreover, it permits the attainment of certain desirable characteristics, particularly relative to the isolation of the signal and oscillator stages, to an outstanding degree.

Some of the factors of particular significance in the functioning and operation of the tuning circuit of the present invention will now be set forth briefly and in generalized fashion:

(1) *Isolation of oscillator and RF stages.*—The circuitry involved effectively isolates the oscillator stage from the RF stage by providing, between the mixer transistor and the RF stage, a low impedance path for the oscillator signals. As a result the RF stage circuitry is not affected by the oscillator signal. Hence the RF stage (together with the mixer stage) may be aligned while the oscillator stage is unenergized or disconnected, and the subsequent connection and energization of the oscillator stage does not appreciably affect the alignment of the RF or mixer circuits. Thus the RF stage and the oscillator stage may be independently aligned or adjusted, making for much greater convenience in manufacture.

(2) *Matching of oscillator stage to mixer stage.*—The load for the oscillator stage in the circuit of the present invention is constituted primarily by the emitter-to-base impedance of the transistor in the mixer stage. This transistor impedance is comparatively low, on the order of 100 ohms. The oscillator circuit output impedance, however, is comparatively high. At oscillator frequencies the emitter-to-ground reactance constitutes a low impedance inductive tap on the oscillator tank circuit, thus making for more efficient power transmission from oscillator to mixer and inhibiting the tendency of the circuit to produce spurious oscillations.

(3) *Matching of RF stage to mixer stage.*—The bypass circuit provided between the base of the mixer transistor and ground cooperates with the conventional coupling capacitor between the RF stage and the mixer stage to match the normally large RF stage output impedance to the small mixer stage input impedance to which it is connected. Hence power transfer is made more efficient and the desired double-tuned response curve of the mixer stage is achieved over the entire band of frequencies.

(4) *Optimization of conversion gain.*—Through suitable choice of the parameters of the bypass circuit connected to the emitter of the mixer transistor, the optimum amount of power input from the oscillator to the transistor can be effected in order to obtain optimum conversion gain in the mixer circuit. Adjustment of the injection characteristics can be accomplished by varying the inductance of that bypass circuit so as to achieve best results at the high frequency end of the frequency spectrum. This will also provide substantially for optimum injection throughout the spectrum, since the rise of oscillator power with decrease in oscillator frequency will be compensated for by the lowered impedance of the bypass circuit at those lower frequencies.

(5) *Image rejection and radiation reduction.*—The bypass circuit connected between the base of the mixer transistor and ground can have its parameters so chosen as to present a particularly low impedance at frequencies in the ranges of the image frequencies and oscillator radiation frequencies involved, thus effectively bypassing those frequencies and hence reducing their effect on the operation of the receiving set in which the tuning circuit is installed. Considerable latitude is possible in selecting the frequencies primarily to be attenuated.

(6) *Compensation for variations in transistor capacitance.*—One major problem in the use of transistors today is that the characteristics, and particularly the inter-electrode capacitance, of individual transistors which are supposedly identical may nevertheless vary widely. In the present system the capacitance in the bypass circuit between the mixer transistor base and ground is considerably larger than the emitter-base capacitance of that transistor, and hence variations in the inter-electrode capacitance as between individual transistors will have only a minimal and unimportant effect on the overall operation of the circuit.

(7) *Mixer gain.*—A mixer transistor will have a good value of gain if its emitter-to-ground impedance is low. In the circuit of the present invention the emitter-to-ground impedance defined by the bypass circuit provided between the emitter and ground is quite low at the intermediate frequency at which the mixer operates. Hence effective mixer gain is attained.

One of the most significant features about the circuit of the present invention is that the same circuit parameters may be utilized to satisfy a plurality of the above factors, and that all of the above factors are satisfied through the use of but a pair of simple bypass circuits utilized in combination with the disclosed type of connection of the oscillator and RF stages to a mixer transistor.

Figure 2:
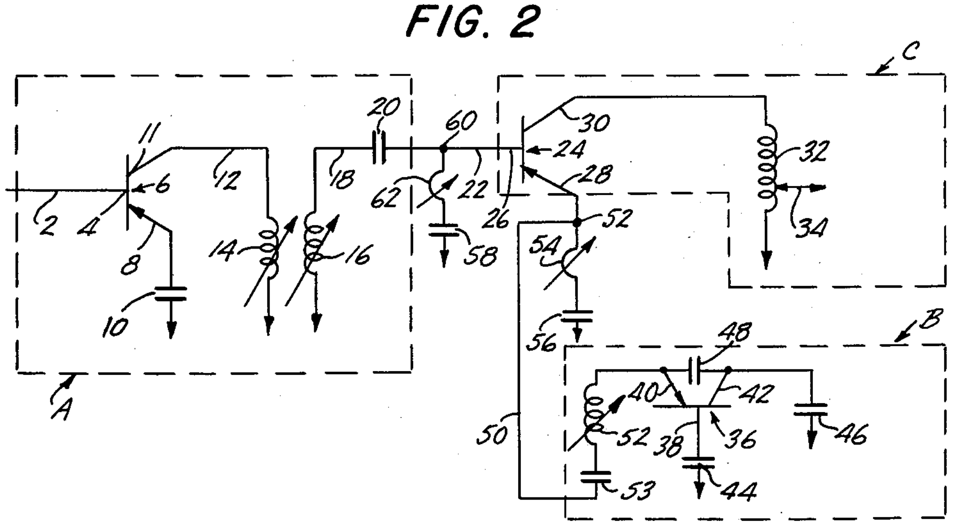

To the accomplishment of the above, and to such other objects as may hereinafter appear, the present invention relates to the construction and arrangement of a tuning circuit as defined in the appended claims and as described in this specification, taken together with the accompanying drawings, in which:

FIGS. 1 and 2 represent alternative embodiments of the tuning circuit of the present invention.

Referring first to FIG. 1, there is disclosed in schematic form an RF stage generally designated A, an oscillator stage generally designated B, and a mixer stage generally designated C. The RF stage is conventionally shown as comprising an input line 2 leading to the base 4 of an RF transistor 6, the emitter 8 of which is connected via capacitor 10, which may have a value of 1000 mmf., to a common return line such as ground. The collector 11 thereof is connected by lead 12 to tunable coil 14 which is electromagnetically linked with tunable coil 16, the inductances of the coils 14 and 16 being variable in conventional fashion in order to tune the RF stage to the frequency of the particular television channel reception of which is desired. The coil 16 is connected by lead 18 and coupling capacitor 20, which may have a capacitance of 5 mmf., to lead 22 which connects with the mixer stage C.

The mixer stage C comprises a PNP type transistor 24 having a base 26, an emitter 28, and a collector 30, the collector 30 being connected to the coil 32, from which the intermediate frequency output is tapped via lead 34.

The oscillator stage B is here schematically and typically illustrated as comprising a transistor 36 having base 38, emitter 40 and collector 42, the base 38 being connected to ground via 1000 mmf. capacitor 44, the collector 42 being connected to ground via 1.5 mmf. capacitor 46, the emitter 40 and collector 42 being connected to one another by 1.5 mmf. capacitor 48, and the emitter 40 being connected to the oscillator output lead 50 via variable inductance 52 and 7 mmf. coupling capacitor 53.

The oscillator output lead 50 is connected to the emitter 28 of the mixer transistor 24 at point 52. A first bypass circuit defined by adjustable inductance 54 and capacitor 56 is connected between the point 52 and ground. The capacitor 56 may have a capacitance value of 1000 mmf. A bypass capacitor 58, which may have a capacitance value of 30 mmf., is connected between ground and point 60 on the lead 22 connecting the output of the RF stage A to the base 26 of the mixer transistor 24, and an adjustable inductance 62 is shown in the line 22 between the point 60 and the mixer transistor base 26. The bypass circuit between the mixer transistor base 26 and ground is defined by the capacitor 58 and the inductance 62. It will be understood that the inductances 54 and 62 may be discrete circuit components (wire coils or curved leads at the television frequencies of particular interest), or may in some instances consist entirely of the inherent inductance of the circuit connections such as socket terminals and standard leads. In a typical circuit inductance 54 may have a value of ground .015 microhenry and inductance 62 may have a value of around .010 microhenry.

The circuit of FIGURE 2 is the same as that of FIGURE 1 except that inductance 62 is shown connected between the capacitor 58 and the point 60 on lead 22.

It will be seen that in the circuit of the present invention the output of the oscillator stage is connected to ground via inductance 54 and capacitor 56, and that the mixer transistor emitter 28 is connected to the oscillator stage B at point 52 on lead 50, just above the bypass circuit 54, 56, said circuit 54, 56 also serving as a bypass from the emitter 28 to ground. The output of the RF stage A is connected to ground via the capacitors 20 and 58, and the base 26 of the mixer transistor 24 is connected to the signal stage A at point 60 between the capacitors 20 and 58. The capacitor 58 and inductance 62 constitute a bypass circuit from the mixer transistor base 26 to ground.

The parameters of the bypass circuit 58, 62 are such as to present a very low impedance to the oscillator frequencies throughout the range over which the oscillator is tuned for television channels 7–13. The signal frequency range for this band is from 179 mc. to 215 mc. The corresponding oscillator frequencies are from 221 mc. to 257 mc. Moreover, oscillator power is injected into the mixer stage from a low impedance point on the oscillator tank. Since the base-to-ground impedance is very low by virtue of inductance 62 and capacitor 58 and since the oscillator injection voltage is divided between the emitter-to-base impedance and the low base-to-ground impedance, very little oscillator voltage appears from base to ground. Hence the oscillator signal, after it passes through the mixer transistor 24, does not appreciably enter the RF stage A and does not to any appreciable degree pass through the tank circuit of that stage. Hence the operation of the RF stage is isolated from the oscillator stage B to an exceptionally high degree, so much so that the RF stage A may be calibrated and aligned with the oscillator stage B de-energized or disconnected. The oscillator stage B may be independently calibrated and aligned. Subsequent connection of the oscillator stage B into the circuit and the energization thereof will not have any appreciable effect upon the alignment of the RF stage A, or, for that matter, on the mixer stage C. The ability to independently align the RF stage A and the oscillator stage B represents a very significant manufacturing advantage.

As a further important refinement, the values selected for the inductance 62 and the capacitor 58 may be so chosen as not only to provide a low impedance over the range of higher oscillator frequencies, as mentioned in the preceding paragraph, but also so as to improve the image rejection and reduce the oscillator radiation of the circuit. Since these problems are particularly troublesome at the higher frequencies, values may be selected which will cause the bypass circuit 58, 62 to enter into series resonance at a frequency near the image frequency of channel 13, for example. Since the $C/L$ ratio of the bypass circuit 58, 62 is fairly high, the resonance characteristics will be fairly broad and consequently the dip in the overall response curve will be broad, thus providing for significant increase in image rejection over a fairly wide range. It has been found that best results are achieved in normal production if series resonance occurs at a compromise value of 280 megacycles, approximately midway between the oscillator frequency of 257 megacycles and the image frequency of 303 megacycles for channel 13, but the design of the circuit is such that considerable latitude is permitted in order to meet and solve special situations.

The value of the capacitance of capacitor 58 is quite large in comparison with the inter-electrode capacitance between the emitter 28 and base 26 of the mixer transistor 24. Hence the capacitor 58 "swamps" the emitter-base capacitance of the transistor 24, and such variations in that emitter-base capacitance as unavoidably occur between individual transistors will be effectively masked insofar as the overall operation of the circuit is concerned. Assembly of these circuits on a production basis is greatly facilitated by reason of this feature.

The output impedance of the RF stage A, up to the point 60 on the lead 22, is very much greater than the input impedance of the mixer transistor 24 to which the signal stage is connected. This impedance mis-match, if uncorrected, makes for inefficient power transfer and prevents the mixer circuit from having the double-tuned response which is so desirable. However, in the instant circuit the output of the RF stage A is connected to ground by the capacitors 20 and 58, and the mixer transistor 24 is connected thereto at point 60 between the capacitors 20 and 58. The ratio between the capacitance values of the capacitors 20 and 58 is such as to provide for an effective impedance match between the output impedance of the RF stage A and the input impedance of the mixer stage C. In the circuit of FIG. 2, where the inductance 62 is connected between the capacitor 58 and the point 60 on lead 22, that inductance 62 also figures in the impedance match, and adjustment of that inductance, as by bending or distorting a portion of a coil or lead, can be carried out in order to achieve the best possible impedance match between RF stage A and the mixer stage C.

The output impedance of the oscillator stage B is likewise considerably higher than the input impedance of the mixer stage C to which it is to be connected. In the present circuit the output of the oscillator stage B is connected to ground via the circuit 53, 54, 56, and the mixer stage C is connected thereto at point 52 between that bypass circuit 54, 56 and the oscillator coupling capacitor 53. The parameters of the bypass circuit 54, 56 and of the coupling capacitor 53 are so related to one another and to the parameters of the oscillator stage B itself that connection of the mixer transistor emitter 28 to point 52 on lead 50 provides for an effective match of impedances as between the oscillator stage B and the mixer stage C. Hence efficiency of power transfer is improved and the occurrence of spurious oscillations in the oscillator stage B, so-called "squegging," is prevented. Here again the inductance 54, when defined by an accessible circuit element, may be adjusted to provide for optimum impedance matching.

The bypas circuit 54, 56 has its parameters so chosen as to provide a very low impedance at the intermediate frequency for which the tuning circuit is designed. As is well known, when the emitter-to-ground impedance of a transmistor is low the gain of the transistor will be high. Consequently good mixer gain is achieved.

The bypass circuit 54, 56 serves another very important function. Through the choice of proper parameters therefor consistent with the factors discussed above the oscillator power injected into the mixer circuit can be optimized. In practice the value of inductance 54 is adjusted in any appropriate manner to provide for optimum power injection at the highest frequency involved (i.e. channel 13). This is particularly convenient for production line adjustment. The characteristics of the injection curve for the lower frequencies (e. g. channels 2–12) will then be either at or close to optimum value because a decrease in oscillator frequency results in an increase in oscillator power, but at the same time the impedance of the bypass circuit 54, 56 will decrease, thus bypassing a greater proportion of the total oscillator output to ground. Hence the injection voltage will vary in a manner consistant with best conversion gain.

From the above explanation it will be apparent that each of the components of the bypass circuits 58, 62 and 54, 56, when taken in combination with the overall circuit and manner of connection here disclosed, will serve a number of functions which, when considered together, enables the tuning circuit of the present invention to satisfy the requirements of a commercially practical tuning circuit in a noteworthy manner, and to satisfy some of those requirements in a manner markedly superior to previously known circuit arrangements. At the same time the circuit is exceedingly simple and inexpensive and requires the use of a truly minimal number of components. It is, moreover, exceptionally well adapted for large scale production, assembly and alignment.

The circuit of the present invention has been here specifically disclosed in what may be considered as a basic form (which is nevertheless fully operable as such). It will be appreciated that many refinements may be added thereto (e.g. trap circuits and the like) without affecting its basic mode of operation, and that RF, oscillator and mixer stages of greater complexity or of specifically different design could also be employed. The circuit values here specifically set forth are exemplary only, and not limitive. It will further be understood that although only two circuit arrangements have been here specifically disclosed, many other variations may be made in the specific circuit design without departing from the spirit of the invention as defined in the following claims.

I claim:

1. In a television tuning circuit comprising a signal stage, an oscillator stage, a mixer stage comprising a transistor having base, emitter, and collector, and a common return line; the improvement which comprises a connection between the output of said oscillator stage and said emitter, a first circuit from said emitter to said return line comprising an inductance and a capacitor connected in series and defining a low impedance path for intermediate frequencies and an appreciably higher impedance for oscillator frequencies, a connection between the output of said signal stage and said base, and a second circuit from said base to said return line comprising a capacitor, and inductance being in circuit with said last named capacitor between said base and return line, said second circuit defining a low impedance path for oscillator frequencies in the high band of the television transmission spectrum and an appreciably higher impedance for signal frequencies.

2. In a television tuning circuit comprising a signal stage, an oscillator stage, a mixer stage comprising a transistor having base, emitter and collector and a common return line; the improvement which comprises a connection between the output of said oscillator stage and said emitter, a first circuit from said emitter to said return line comprising an adjustable inductance and a capacitor connected in series and defining a low impedance path for intermediate frequencies and an appreciably higher impedance for oscillator frequencies, a connection between the output of said signal stage and said base, and a second circuit from said base to said return line comprising a capacitor, an adjustable inductance being in circuit with said last named capacitor between said base and return line, said second circuit defining a low impedance path for oscillator frequencies in the high band of the television transmission spectrum and an appreciably higher impedance for signal frequencies.

3. The tuning circuit of claim 2, in which said inductance of said first circuit is adjusted to a value to optimize the conversion gain of said transistor for the high range of frequencies to be tuned.

4. The tuning circuit of claim 1, in which the capacitor and inductance in said first circuit have values such as to be substantially in a series-resonant condition at the intermediate frequency of said tuning circuit.

5. The tuning circuit of claim 1, in which said second circuit, including said inductance, has an impedance at the frequencies to be tuned which is very low when compared with the impedance of said signal stage, and in which the capacitor of said second bypass circuit has a capacitance several times greater than the base-to-emitter capacitance of said transistor.

6. The tuning circuit of claim 1, in which said second circuit, including said inductance, has an impedance at the frequencies to be tuned which is very low when compared with the impedance of said signal stage, and in which the capacitor of said second circuit has a capacitance several times greater than the base-to-emitter capacitance of said transistor, and in which the connection between said signal stage and said base includes a capacitor, the ratio between the capacitance of said last mentioned capacitor and the capacitance of the capacitor of said second circuit being such as to produce optimum impedance matching of said signal stage and said transistor.

7. The tuning circuit of claim 1, in which said second circuit, including said inductance, has an impedance at the frequencies to be tuned which is very low when compared with the impedance of said signal stage, and in which the connection between said signal stage and said base includes a capacitor, the ratio between the capacitance of said last mentioned capacitor and the capacitance of the capacitor of said second circuit being such as to produce optimum impedance matching of said signal stage and said transistor.

8. The tuning circuit of claim 1, in which said second circuit, including said inductance, has an impedance at the frequencies to be tuned which is very low when compared with the impedance of said signal stage, and in which the inductance and capacitor of said second circuit have values such as to resonate at a frequency in the range of image frequencies and oscillator frequencies for the frequencies to be tuned.

9. The tuning circuit of claim 1, in which said second circuit, including said inductance, has an impedance at the frequencies to be tuned which is very low when compared with the impedance of said signal stage, and in which the inductance and capacitor of said second circuit have values such as to resonate at a frequency between the image frequency and the oscillator frequency corresponding to the high range of signal frequencies to be tuned.

10. The tuning device of claim 1, in which said second circuit, including said inductance, has an impedance at the frequencies to be tuned which is very low when compared with the impedance of said signal stage, and in which the inductance and capacitor of said second circuit have values such as to resonate at a frequency in the range of image frequencies and oscillator frequencies for the frequencies to be tuned, and in which the $C/L$ ratio of said second circuit, including said inductance, is high.

11. In a television tuning circuit comprising a signal stage, an oscillator stage, a mixer stage comprising a transistor having base, emitter and collector, and a common return line, said signal stage being connected to said base, the improvement which comprises said oscillator being connected directly to said emitter across an adjustable inductance in series with an emitter bypass capacitor connected to said return line said adjustable inductance and bypass capacitor defining a low impedance intermediate frequency path which has an appreciably higher impedance for oscillator frequencies a bypass circuit having a very low impedance to high oscillator frequencies and an appreciably higher impedance for signal frequencies being connected between said base and said return line.

12. In a television tuning circuit comprising a signal stage, an oscillator stage, a mixer stage comprising a transistor having base, emitter and collector, and common return line, said signal stage being connected to said base, the improvement which comprises said oscillator being connected directly to said emitter across an adjustable inductance in series with an emitter bypass capacitor connected to said return line said adjustable inductance and bypass capacitor defining a low impedance intermediate frequency path which has an appreciably higher impedance for oscillator frequencies, a bypass circuit to said return line having a very low impedance to high oscillator frequencies and an appreciably higher impedance for signal frequencies being connected to said base and comprising a bypass capacitor, an inductance being in series with said last named capacitor between said base and said return line.

References Cited in the file of this patent

UNITED STATES PATENTS

| | | |
|---|---|---|
| 2,278,030 | Weber | Mar. 31, 1942 |
| 2,760,061 | Pan | Aug. 21, 1956 |
| 2,789,213 | Marks et al. | Apr. 16, 1957 |
| 2,841,703 | Bopp | July 1, 1958 |
| 2,878,376 | Stern | Mar. 17, 1959 |
| 2,880,312 | Koch | Mar. 31, 1959 |
| 2,891,145 | Bradmitter | June 16, 1959 |

FOREIGN PATENTS

| | | |
|---|---|---|
| 457,109 | Great Britain | Nov. 20, 1936 |

OTHER REFERENCES

"Trap Circuits for Television Receivers," Radio and Television News, September 1948, pages 58, 59, 128, 130, 131.

"The Thunderbird, a New Transistorized Portable Radio," by Vanacore in "Sylvania Technologist," April 1957, pages 35–37.